United States Patent [19]

Underwood

[11] Patent Number: 4,782,324

[45] Date of Patent: Nov. 1, 1988

[54] DIGITAL SIGNAL SYNTHESIZER

[75] Inventor: Marcos A. Underwood, Monta Vista, Calif.

[73] Assignee: GenRad, Inc., Concord, Mass.

[21] Appl. No.: 47,203

[22] Filed: May 6, 1987

[51] Int. Cl.⁴ .............................................. H03M 1/12
[52] U.S. Cl. ..................................... 341/147; 364/724
[58] Field of Search ............... 340/347 AD; 364/723, 364/724

[56] References Cited

U.S. PATENT DOCUMENTS 4,467,316 8/1984 Musmann et al. ............ 340/347 DA
4,495,591 1/1985 Loomis, Jr. ........................ 364/724

OTHER PUBLICATIONS

Multirate Digital Signal Processing, pp. 202 et seq., Crochiere and Rabiner.

Primary Examiner—William M. Shoop, Jr.
Assistant Examiner—Richard K. Blum
Attorney, Agent, or Firm—Limbach, Limbach & Sutton

[57] ABSTRACT

A method and apparatus for converting a digital signal into a band-limited analog signal with variable bandwidths, a high level of performance, high spurious frequency rejection, and simple implementation, employing polyphase interpolating digital filters, a fixed-sampling rate digital to analog converter, and a fixed-frequency analog low-pass filter.

22 Claims, 5 Drawing Sheets

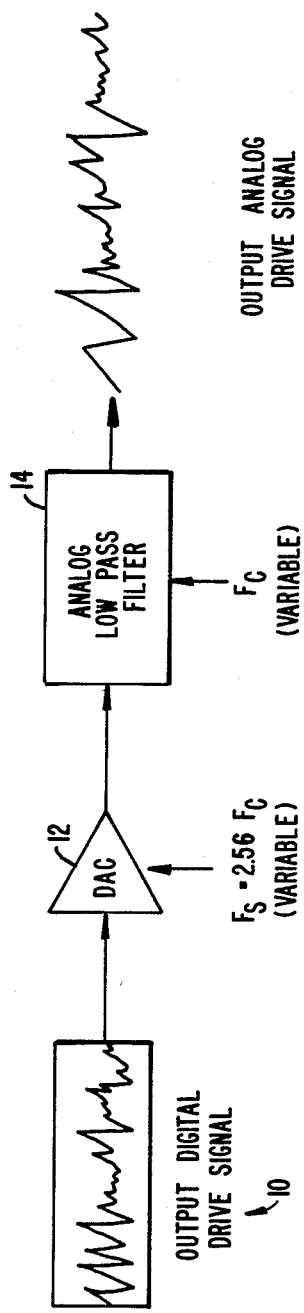
FIG._1A. (PRIOR ART)
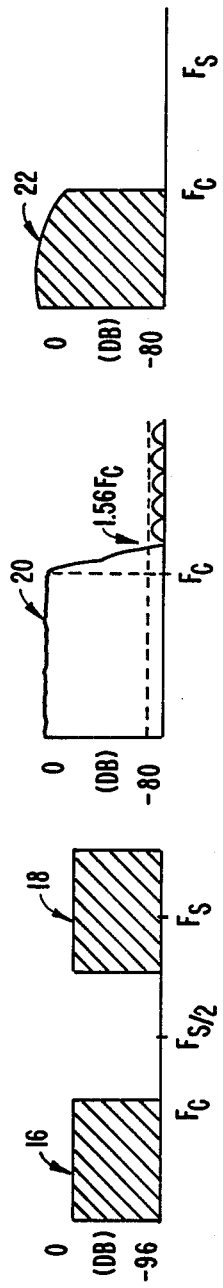
FIG._1B.

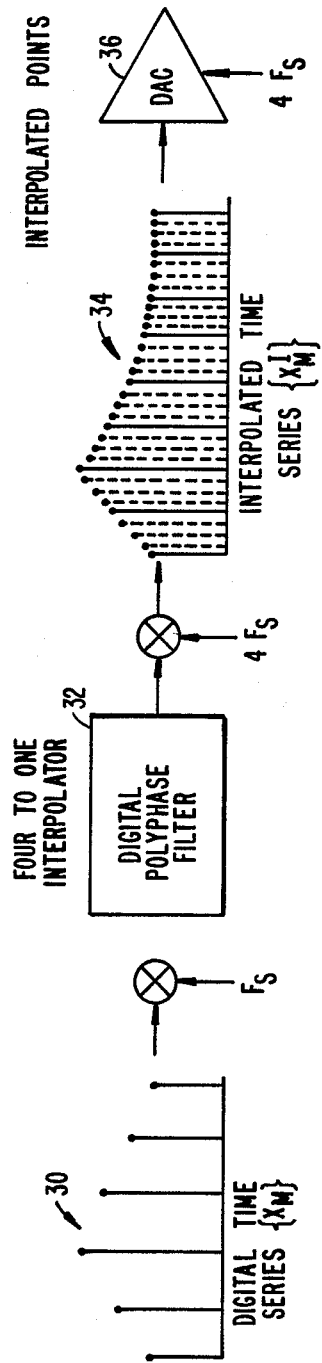
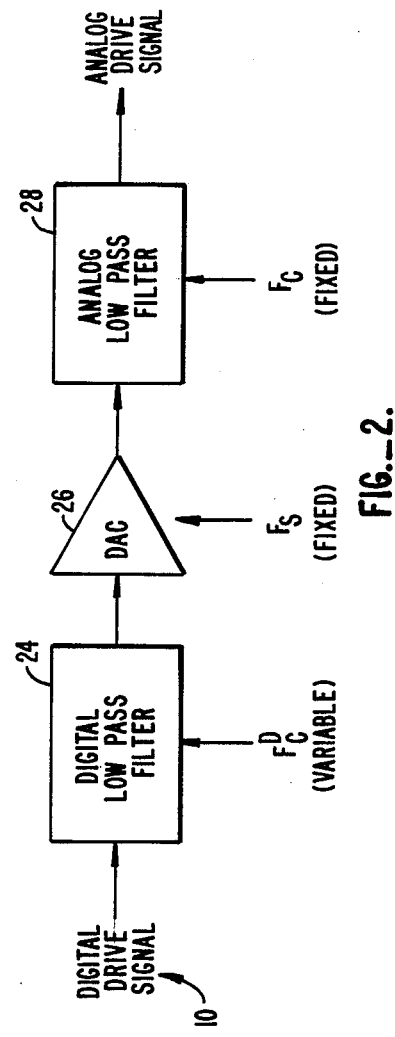

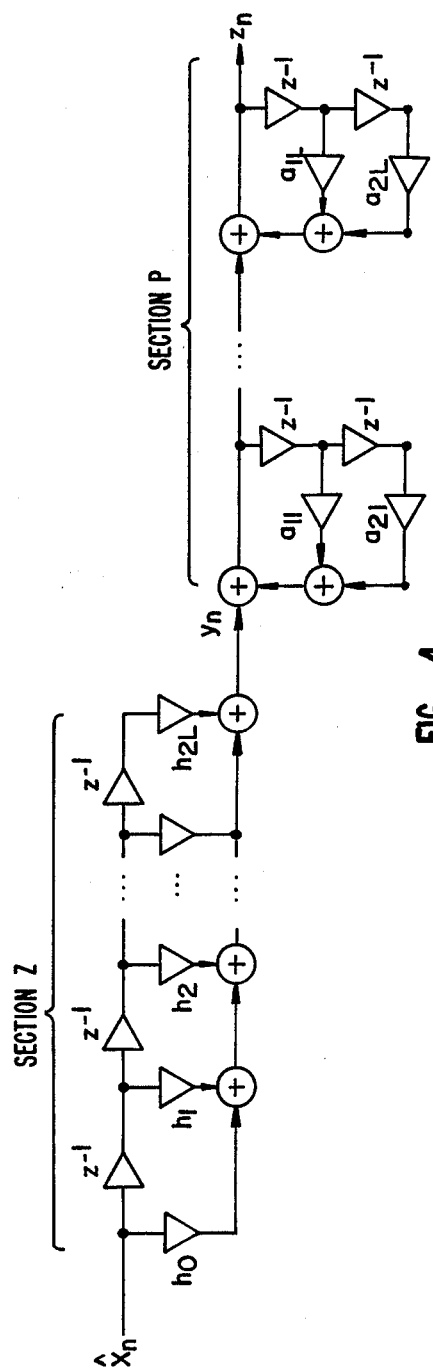
FIG._4.
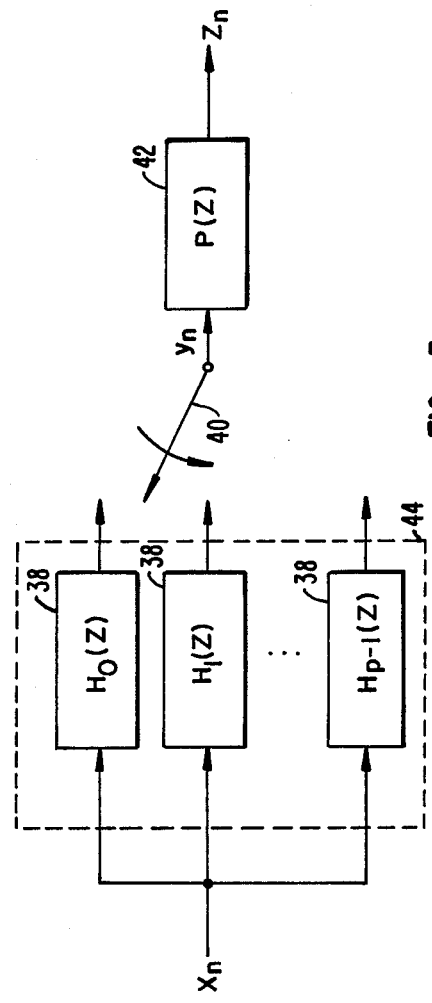
FIG._5.

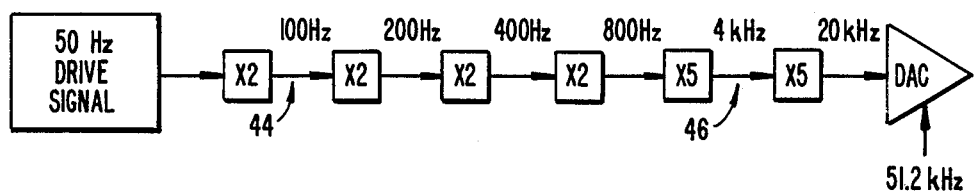
FIG._6.
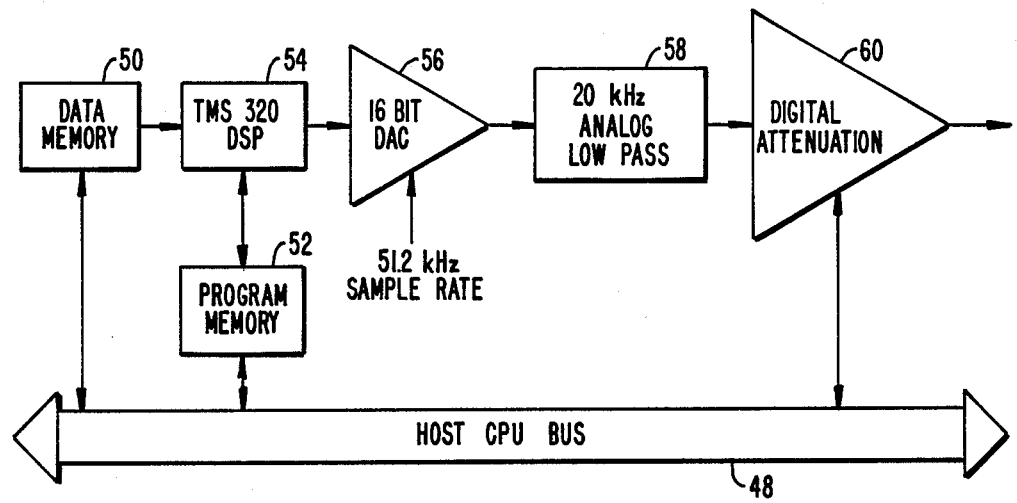
FIG._7.

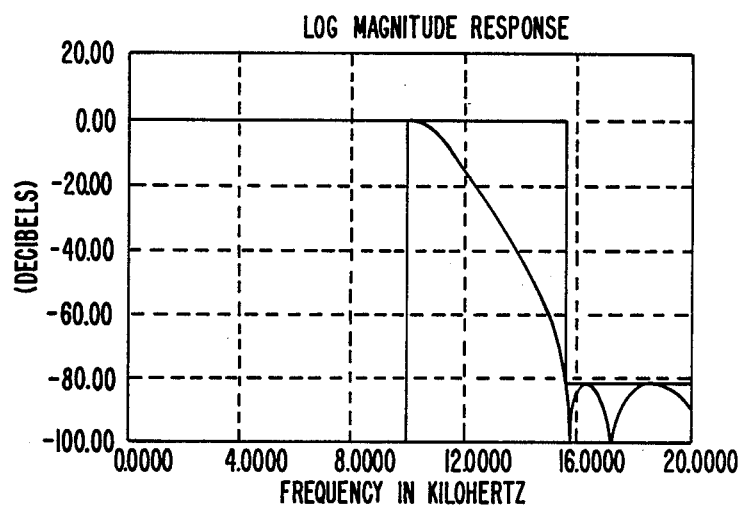
FIG._8.
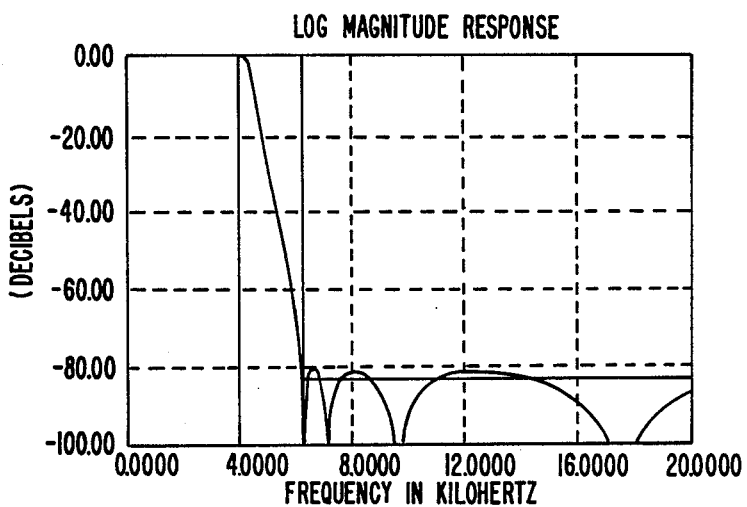
FIG._9.

DIGITAL SIGNAL SYNTHESIZER

DESCRIPTION

1. Technical Field

The present invention is directed in general to signal synthesis, and more particularly to an apparatus for providing a variable, high quality, digitally synthesized drive signal suitable for use in vibration analysis systems.

2. Background Art

In the typical vibration analysis system, equipment under test is subject to a wide range of different vibrational conditions to determine whether the equipment will function properly in its intended physical environment. Because the vibrational conditions required can vary greatly, a vibration analysis system should be capable of providing a wide range of drive signals.

The typical vibration analysis system includes a platform or table having linear or rotary actuators which are driven by what is termed an output drive signal. Output drive signals can be aperiodic, periodic, sinusoidal, pseudorandom, a mixture of sinusoidal and noise, and so on. Because the accuracy of a vibrational test is dependent upon the accuracy by which the output drive signal can be generated, a great deal of effort has been directed at providing high quality output drive signals which can have a wide variety of different characteristics.

In the more recent past, output system designers have attempted to provide this facility by way of signal synthesis. In such systems, a digital drive signal is converted into an analog drive signal by a digital to analog converter (DAC) and filtered by an analog low pass filter. The digital drive signal is presented to the DAC at a rate of $F_s$ samples per second. The analog low pass filters are typically high performance elliptic filters with pass band ripple of plus or minus 0.15 decibels, and stop band attenuation of 80 decibels or better.

Typically, the output drive signals will be characterized as being of particular frequency ranges. For example, a drive signal in the 400 Hz range is a signal having a spectral content of frequencies up to 400 Hz. In output drive signal generation systems it is typical that a distinct drive signal is provided for each different frequency range. For a particular range, the drive signal is stored in digitized form in the form of words which are derived from the desired drive signal waveform at a sample rate equal to at least two times the highest frequency in the frequency range.

When a drive signal for a different frequency range is to be synthesized the digitized data for the drive signal of that frequency range is supplied to the DAC at the sample rate for that drive signal. An analog filter having a cutoff frequency at the highest frequency of the frequency range is then used to remove the sum and difference terms generated from the DAC conversion process. Thus it can be seen that, as signals in different filter ranges are desired, the sampling frequency of the DAC and the cutoff frequency of the analog filter must be changed accordingly While in theory previous output drive systems provide satisfactory drive signals, in practice there are a number of significant drawbacks to the current state of the art. Variable analog filters consume large circuit area and require complex calibration. Further, the DAC must be operable over a range of different sampling rates, $F_s$, required to handle the range of signals desired. This places significant design requirements on both the analog filter and DAC, as well as on the system in which they are to operate.

There have also been specialized signal generation structures used in CODEC devices which operated over narrow frequency ranges and which are believed to have utilized digital filters such as a spline filter or its equivalent. The digital filter was followed by a fixed conversion rate digital to analog converter and a fixed frequency analog low pass filter. However, due to the specialized nature of the signal requirements for such devices, a very limited range of signals was generated. These structures suffer from unacceptable levels of spurious signals due to the pass band/stop band characteristics of the digital filters used and the conversion effects of the digital to analog converter. These structure could not accommodate a wide range of interpolating factors and, in general, produced signals not suitable for general signal analysis. The nature of such structures is that in order to achieve acceptable levels of performance an unacceptably high computational load results.

SUMMARY OF THE INVENTION

These and other disadvantages of prior signal synthesis approaches are overcome by the present invention of a method and apparatus for synthesizing a designated signal having a range which is selectable up to an analysis frequency, wherein the signals are synthesized from a base level signal having a digital representation at a predetermined sample rate, comprising means operating at a fixed conversion rate, for converting a digital representation of a signal into analog form; digital filter means for interpolating the digital representation of the base level signal to have a sample rate corresponding to the conversion rate and simultaneously achieving flat pass band ripple and high stop band attenuation, and for supplying the interpolated digital representation to the converting means, wherein the amount of interpolation provided is determined by dividing the conversion rate by the predetermined sample rate; and filter means, having a cutoff frequency which is fixed at a frequency corresponding to the analysis frequency and coupled to the converting means, for suppressing frequencies above the analysis frequency.

More generally, the present invention provides a high performance, processor efficient, filtered, multirange digital-to-analog conversion technique utilizing a combination of interpolating digital filters and a single fixed frequency analog filter.

In accordance with the present invention a method and apparatus are described for converting a digital signal into a band-limited analog signal with variable bandwidths, a high level of performance, high spurious frequency rejection, and which is easily implementable. Employed are polyphase interpolating digital filters, a fixed sampling rate DAC, and a fixed-frequency analog low-pass output filter. The use of multiple cascaded polyphase interpolating digital filters makes possible computation-efficient interpolation by large factors.

The invention recognizes that an elliptic filter supplies the required pass and stop band characteristics for a high quality output signal. Further it is recognized that, even though a classical elliptic filter cannot be employed as an interpolator because it supplies one point out for one point in, its transfer function is implementable in digital filter form and can be used as an interpolator. More specifically, a bank of parallel finite impulse response (FIR) filters is employed. The FIR filters operate upon the same input signal, and sequentially supply their output signals to an infinite impulse response (IIR) digital filter. It is recognized that the elliptic filter transfer function can be expressed in pole and zero form where the zeros can be handled by the parallel bank of FIR filters and the poles are handled by the single IIR filter.

It is therefore an object of the present invention to provide a signal synthesis method and apparatus for simply and efficiently generating a wide variety of periodic and aperiodic signals over a wide frequency range.

It is another object of the present invention to provide a output drive signal method and apparatus which employs a base digitized drive signal, an interpolating digital filter providing selectable amounts of interpolation, a fixed sampling rate DAC, and a fixed cutoff frequency analog low pass filter.

It is a further object of the present invention to provide a signal synthesis method and apparatus in which digital elliptic filters are used as interpolators.

It is a still further object of the present invention to provide a digital elliptic filter structure which can be easily and efficiently implemented.

It is a still another object of the present invention to provide a digital elliptic filter method and structure which can be easily and efficiently implemented, which method and structure employ a polyphase FIR structure which implements all of the zeros of the elliptic filter transfer function, followed by an IIR structure which implements all of the poles of the elliptic filter tranffer function.

It is another object of the present invention to provide an efficient and simple digital elliptic filter method and structure which provides large interpolation factors, and which can be used to synthesize a wide variety of signals, by cascading a plurality of low-interpolation-factor digital elliptic filter structures, the product of which equals the desired large interpolation factor.

These and other objects, features and advantages of the present invention will be more readily understood upon consideration of the following detailed description of certain preferred embodiments of the present invention and accompanying drawings.

BRIEF DESCRIPTION OF THE DRAWINGS

FIG. 1A is a simplified block diagram of the traditional synthesis approach to signal generation.

FIG. 1B illustrates the spectral relationship of the various stages of the signal synthesis of FIG. 1B.

FIG. 2 is a simplified block diagram of the present invention.

FIG. 3 is a simplified illustration of the interpolation function being performed by the digital elliptic filter of the present invention.

FIG. 4 is a generalized expression of the digital elliptic filter structure of the present invention in which the filter transfer function is expressed in the form of poles and zeros, and the zeros are implemented as a FIR structure and the poles are implemented as an IIR structure.

FIG. 5 is a conceptual block diagram of the digital elliptic filter structure of the present invention wherein an FIR polyphase structure implements all zeros of the filter transfer function and an IIR structure implements all of the poles of the filter transfer function.

FIG. 6 is a simplified block diagram illustrating how cascading of simple, low interpolating factor stages can provide a large interpolation factor.

FIG. 7 is a simplified block diagram of a output architecture in accordance with the present invention.

FIG. 8 is a graph of the response of a ×2 interpolating elliptic digital filter in accordance with the present invention.

FIG. 9 is a graph of the response of a ×5 interpolating elliptic digital filter in accordance with the present invention.

DETAILED DESCRIPTION OF THE PREFERRED EMBODIMENT

Referring to FIG. 1A, a traditional approach to signal synthesis is shown. A digitized representation 10 of a base level signal is provided to a DAC 12. The digital representation has a sample rate of 2.56 times the highest frequency in the range for the base level signal, $F_c$. DAC 12 operates at a variable sample rate of $F_s=2.56F_c$. The cutoff frequency of analog low pass filter 14 is $F_c$. $F_s$ is variable and selected according to $F_c$, the highest frequency in the range of signals being synthesized. $F_c$ can range from 50 Hz to greater than 5 KHz. Thus, DAC 12 must be capable of operating a varying sample rates and the analog low pass filter 14 must have variable cutoff frequencies.

As discussed in the Background Art section above, the structure of FIG. 1A is complex, is large in size, lacks good repeatability, and is expensive.

FIG. 1B illustrates the spectral relationship between the output of the DAC 12, the transfer function of the analog low pass filter 14, and the eventual output analog drive signal. From the rightmost graph, it can be seen that the output of the DAC 12 has two spectral groups: (1) the group 16 representing the signal to being synthesized, and (2) the group 18 representing the sum and difference terms which arise from the sampling operation performed by the DAC 12. The center graph illustrates the transfer function 20 of the analog low pass filter 14.

The leftmost graph shows the output spectrum 22 from the analog low pass filter 14. Note that there is a slightly rounded magnitude of the frequency response in the spectral group which remains, due to the multipass band characteristics of the DAC 12, and also that the spectral group which was centered about $F_s$ has been reduced to a very small magnitude.

FIG. 2 is a simplified block diagram of the present invention. The base level or digital drive signal 10 is supplied to a digital low pass filter 24 which provides a variable interpolation function. The interpolated base level signal is applied to DAC 26, which has a fixed sampling rate. The interpolated base level signal is converted into analog form by DAC 26 and applied to a fixed-cutoff-frequency, analog low pass filter 28. The output of analog low pass filter 28 is the desired analog drive signal.

Preferably, the digital low pass filter 24 should have a pass band ripple of no more than 0.3 dB and a high stop band attenuation of greater than 60 dB.

Digital low pass filter 24 is preferably a digital elliptic filter having a cutoff frequency which is selected according to the amount of interpolation required to bring the sample rate of the base level signal up to the sample rate of DAC 26 divided by 2.56. It is to be understood that the factor 2.56 is selected to satisfy the requirements of the well known Sampling Theorem, wherein it is stated that where $F_s$ is greater than or equal to $2F_c$, a continuous signal $x_c(nT)$ having a bandlimited Fourier transform can be uniquely reconstructed without error from equally spaced samples $x_c(t)$, where $F_s$ is the sampling frequency. Thus it is to be understood that other factors, greater than or equal to 2, can be used successfully. In practice it has been found that factors greater than or equal to 2.56 are most desirable to implement in order to make optimal use of the synthesis bandwidth.

It is to be noted that the structure of the present invention differs greatly from previous approaches. For example, the present invention uses a fixed sample frequency DAC. The analog low pass filter 28 is also a fixed frequency filter. The interpolation factor provided by digital low pass filter 24 permits the use of digital representations of signals which are taken at different sampling rates. Thus, even though a 50 Hz sinewave might be digitized at a 128 samples per second rate, and a 200 Hz sinewave might be digitized at 512 samples per second, the analog low pass filter 28 and the DAC 26 will operate at the same fixed rate; no changes are required in the conversion rate of DAC 26 or the cutoff frequency of analog low pass filter 28. Only the amount of interpolation provided changes, where such amount is determined by dividing the conversion rate of DAC 26 by the sample rate at which the base signal was digitized.

It is to be understood that such a structure also permits the synthesis of different frequencies of a particular waveform shape digitized at a particular sampling rate by varying the amount of interpolation and also the rate at which the samples are read out of memory or supplied to the digital low pass filter 24.

For example, FIG. 3 shows a digital time series 30 having a sample rate of $F_s$, a digital filter 32 which operates as a four to one interpolator, an interpolated time series 34, and a DAC 36 which operates at a sample rate of $4F_s$. For purposes of this example, assume that the digital time series 30 represents a 50 Hz signal at the sample rate $F_s$ of 128 samples per second. Because the DAC 36 is operating at $4F_s$, an interpolate by four digital filter is employed so that the output of DAC 36 is a 50 Hz signal. From interpolated time series 34 it can be seen that three interpolated samples are provided between each of the actual data samples. If the digital time series 30 were applied directly to DAC 36 at the sample rate of $4F_s$ a 200 Hz signal would be produced at the output of DAC 36. Similarly, if digital filter 32 implemented a two to one interpolator, and the digital time series 30 the signal were provided to DAC 36, the output of DAC 36 would be a 100 Hz signal. As is apparent from the discussion and the figures herein, no change in the resolution of the samples, i.e. the number of bits representing the sample, is contemplated between those applied to the input of the interpolators and those provided at the output of the interpolators and applied to DAC 36.

Thus it is to be appreciated that the structure of FIG. 2 provides an extremely versatile and flexible signal synthesis structure. With such a structure only a single fixed frequency analog low pass filter 28 is needed. Moreover, because analog low pass filter 28 is operated to filter out spurious signal produced by DAC 26, its cutoff or analysis frequency is high; i.e. preferably $F_c = 2.56F_s$, where $F_s$ is the conversion frequency of DAC 26. This reduces the physical size of the filter. Further, the DAC 26 need operate only at a single frequency. It should be appreciated that the above greatly reduces the complexity, size and cost of a synthesis system.

In theory it is known that elliptic digital filters can be used to provide an interpolation function. See for example Crochiere and Rabiner, 1983, Prentice-Hall, p. 189, "Multirate Digital Signal Processing." However, in practice, elliptic digital filters as interpolators are difficult to implement.

In the preferred embodiment of the present invention an unique implementation of the interpolating digital elliptic filter is employed: that is, a polyphase, all zero, FIR filter, followed by an all pole, IIR digital filter. It can be shown that the z transform for an elliptic filter can be expressed in the biquadratic form $$H(z) = \prod_{e=1}^{L} \frac{(b_{0e} + b_{1e}z^{-1} + b_{2e}z^{-2})}{(1 - a_{1e}z^{-1} - a_{2e}z^{-2})} \qquad \text{(Eqn. 1)}$$

where the filter is a $2L_{th}$ order filter, with the "b's" and "a's" representing coefficients.

Further, in accordance with the present invention, the zeros of the above equation can be implemented in a FIR form while the poles can be implemented in an IIR form. This is shown in FIG. 4, wherein section Z is the FIR implementation of the zeros and section P is the IIR implementation of the poles. The "h's" are coefficient terms which are functions of the "b" coefficients in the numerator of Eqn. 1, above. The "a's" correspond to the "a's" of the denominator of Eqn. 1, above.

In FIG. 4, $\{\hat{x}_n\}$ is the zero padded version of the digital drive signal input, where $N-1$ zeros are inserted between each actual word of the digital drive signal to form $\hat{x}_n$, and where N equals the amount of interpolation sought.

In accordance with the present invention it is also realized that the FIR form of the numerator of Eqn. 1, above, can be implemented as a polyphase FIR filter 44. This is illustrated in FIG. 5. There it can be seen that a plurality of parallel FIR filter blocks 38 each receive the same input signal $X_n$ at the input sample rate. The output of each block 38 is sequentially scanned by a commutating function 40 to provide a series of input signals, $y_n$, to an all pole IIR filter 42 operating at an output sample rate equal to the number of parallel paths in the polyphase section times the input sample rate. IIR filter 42 implements the denominator of Eqn. 1, above, in a conventional IIR structure satisfying the relationship $$P(z) = \frac{1}{\prod\limits_{e=1}^{L} (1 - a_{1e}z^{-1} - a_{2e}z^{-2})}.$$

Crochiere and Rabiner, "Multirate Digital Signal Processing," supra, p. 79 et seq. discusses the use of polyphase digital filters in general.

For an $8^{th}$ order elliptic filter (L=4), which provides an interpolation by five, four of the block 38 are used. The transfer function for each of the blocks 38 is as follows:

$H_0(z) = h_0 + h_5 z^{-1}$ $H_1(z) = h_1 + h_6 z^{-1}$ $H_2(z) = h_2 + h_7 z^{-1}$ $$H_3(z) = h_3 + h_8 z^{-1}$$

$$H_4(z) = h_4$$

where
- $h_0 = B_{01}B_{02}$
- $h_1 = B_{02}B_{11} + B_{01}B_{12}$
- $h_2 = B_{01}B_{22} + B_{02}B_{21} + B_{11}B_{12}$
- $h_3 = B_{01}B_{32} + B_{02}B_{31} + B_{11}B_{22} + B_{21}B_{12}$
- $h_4 = B_{01}B_{42} + B_{02}B_{41} + B_{11}B_{32} + B_{12}B_{31} + B_{21}B_{22}$
- $h_5 = B_{11}B_{42} + B_{12}B_{41} + B_{21}B_{32} + B_{22}B_{31}$
- $h_6 = B_{21}B_{42} + B_{22}B_{41} + B_{31}B_{32}$
- $h_7 = B_{31}B_{42} + B_{32}B_{41}$
- $h_8 = B_{41}B_{42}$, and
- $B_{01} = b_{01}b_{02}$
- $B_{11} = b_{02}b_{11} + b_{12}b_{01}$
- $B_{21} = b_{02}b_{21} + b_{12}b_{11} + b_{22}b_{01}$
- $B_{31} = b_{12}b_{21} + b_{22}b_{11}$
- $B_{41} = b_{22}b_{21}$
- $B_{02} = b_{03}b_{04}$
- $B_{12} = b_{04}b_{13} + b_{14}b_{03}$
- $B_{22} = b_{04}b_{23} + b_{14}b_{13} + b_{24}b_{03}$
- $B_{32} = b_{14}b_{23} + b_{24}b_{13}$
- $B_{42} = b_{24}b_{23}$ Actual values for the coefficients above (providing an interpolation by five), assuming $F_c = 4$ Khz, $F_{sb} = 6.24$ KHz, stop band magnitude of minus 81.94/dB, pass band of 0.00191, and $L = 4$ are:
- $h_0 = 3768$
- $h_1 = -8987$
- $h_2 = 15504$
- $h_3 = -16172$
- $h_4 = 17637$
- $h_5 = -16045$
- $h_6 = 15337$
- $h_7 = -8877$
- $h_8 = 3730$.

For interpolation by a factor a two, an eighth order filter elliptic filter structure would be used and, in accordance with the present invention, would have parallel arms having the following transfer functions:

$$H_0(z) = h_0 + h_2 z^{-1} + h_4 z^{-2} + h_6 z^{-3} + h_8 z^{-4}$$

$$H_1(z) = h_1 + h_3 z^{-1} + h_5 z^{-2} + h_7 z^{-3}$$

where the coefficients "h__ _" are the same as identified for the interpolate by five example above.

Actual values for the coefficients above (providing an interpolation by two), assuming $F_c = 10$ Khz, $F_{sb} = 15.6$ KHz, a stop band magnitude of minus 81.93/dB, pass band of 0.00051, and $L = 3\frac{1}{2}$, are:
- $h_0 = 1207$
- $h_1 = 5270$
- $h_2 = 11985$
- $h_3 = 17486$
- $h_4 = 17486$
- $h_5 = 11985$
- $h_6 = 5270$
- $h_7 = 1207$
- $h_8 = 0$, where $F_{sb}$ is the stop band corner frequency.

It is to be noted that the transition ratio, $F_c/F_{sb}$, is the same for both interpolators.

Table I below defines the relationship among the conversion or sample rate of DAC 26, the amount of interpolation needed, the sample rate of the digitized drive signal, the cutoff or analysis frequency of low pass analog filter 28, and the cutoff frequency of the digital low pass elliptical filter 24.

The particular transfer functions for each of the parallel arms of the polyphase filter were derived as follows: Referring to FIG. 4, it is observed that $\hat{x}_n$, being very often zero, will cause only part of the coefficients "h" to be active at any give time. Each of the parallel arms 38 then represents the effective filter, i.e. the active "h's" at different points in time.

For example, it can be seen that a times two interpolator, using an eighth order filter structure, will have a zero padded input sequence wherein a zero is inserted between each actual sample. (For a times five interpolator, using an eighth order filter, four zeros will be inserted between each actual sample.) As such, at any given time either all of the odd subscripted coefficients or all of the even subscripted coefficients will be active; i.e. be operating on non zero words. Thus, only two parallel arms are needed to implement filter.

In the times five interpolation case, every $5^{th}$ coefficient will be active at any point in time, thus for any point in time only two of the nine coefficients will be active. Thus, five parallel arms are used to implement the filter.

The same procedure should be used for implementing other magnitudes of interpolation. It should be appreciated that the number of parallel arms needed in the polyphase section is a function of the order of the filter and the level of interpolation. The order of the filter determines the filter characteristics, such as stop band attenuation. In such a manner each arm implements a selected non overlapping subset of the FIR coefficients, where the coefficients are a function of the zeros of the filter transfer function, Eqn. 1. In other words, each non overlapping subset of FIR coefficients are those FIR coefficients which represent active paths of the Z section of FIG. 4 at a particular point in time.

TABLE I

| Variable | Definition | Description |
|---|---|---|
| $F_c$ | | Highest frequency in the range of frequencies being generated. |
| $F_s$ | $2.56 F_c$ | Sample rate at which digital representation of the drive signal was digitized. |
| $F_a$ | | Cutoff frequency of the fixed analog low pass filter at the output of the DAC. Upper limit of synthesis range. |
| $F_d$ | $2.56 F_a$ | DAC sample rate. |
| I | $F_d/2.56 F_c =$ $F_d/F_s$ | Amount of interpolation needed. |
| $F_{en}$ | $F_a/n$ | Elliptic filter cutoff frequency for interpolate by n. |
| $F_{sb}$ | $1.56 F_{en}$ | Stop band frequency. |

In the preferred embodiment of the present invention, the commutating function 40 is performed in software in the following order: (1) process input word $x_n$ with the next parallel FIR section 38 ($H_{p-1}(z)$), (2) process result with IIR filter 42, (3) repeat for next parallel FIR section 38 and process result through IIR filter 42, until all parallel FIR sections 38 have been sampled.

Referring now to FIG. 6, a further aspect of the present invention will now be described. In accordance with the present invention it is recognized that simple polyphase FIR interpolating elliptic filter structures can be cascaded together to obtain higher amounts of interpolation. Thus, as shown in FIG. 6, a 400 to 1 interpolation can be achieved by cascading four 2 to 1 and two 5 to 1 interpolators.

Further, it is also shown that, given the chain of simple interpolators shown in FIG. 6, digitized signals can be injected at various points along the chain such that the appropriate amount of interpolation is provided in light of the sample rate of the signal being injected. For example, a signal in the 100 Hz range would be inserted at point 44. A signal in the 4 KHz range would be inserted at point 46.

While FIG. 6 shows the use of a single chain to provide interpolation for all of the signal ranges shown, alternatively, a separate chain for each signal range can be provided.

As can be seen from FIG. 6, the simple interpolators can be times-two or times-five interpolators. Further, where the signal chain requires pairs of times-two interpolators, times four interpolators can be used.

Reference is made to Crochiere & Rabiner, "Multirate Digital Signal Processing," supra, p. 202, et sec., wherein cascading of filter stages is described generally.

It is to be understood that the present invention contemplates the cascading of simple interpolator sections having similar pass band/stop band transition characteristics. The interpolators used in the present invention should have very sharp transition regions.

A substantial advantage of the cascading of simple interpolator structures is that the simple structures are easily implemented and represent a reasonable computational load. For example, when the filters of the present invention are implemented on a general purpose digital signal processing chip such as the TMS 32010, manufactured by Texas Instruments of Dallas Tex., there is still sufficient computing time left over to handle a random signal generation routine, such as is described in U.S. Pat. No. 3,848,115, issued Nov. 12, 1974 to Edwin A. Sloane, et al.

Other types of drive signal synthesis, such as swept sine wave and transient waveforms can also be accommodated in a real time basis.

Referring now to FIG. 7, a simplified functional diagram of the present invention as incorporated into a shaker system is shown. A host CPU bus 48 permits data memory 50 and program memory 52 to exchange data and program information with the host. Note that data memory 50 and program memory 52 are both dedicated memory. A general purpose digital signal processing (DSP) device, for example the Texas Instrument TMS 32010, is employed to implement the elliptical digital filters described above. Program memory 52 supplies the filter programs and data memory 50 supplies the digitized drive signal data to DSP 54 at the sample rate $F_s$. A 16 bit DAC 56 converts the interpolated data from DSP 54 into analog form at a rate of 2.56$F_s$ (51.2 KHz for example). Analog low pass filter 58 filters out the spurious components above 20 KHz that are present in the output of DAC 56. Finally, a programmable attenuator 60 adjusts the amplitude of the signal before it is applied to the shaker table motors. Preferably, the analog low pass filter is a 9$^{th}$ order, elliptic filter, with ±0.15 dB pass band ripple, and greater than 80 dB stop band attenuation for frequencies greater than 31.2 KHz.

Referring to FIGS. 8 and 9, log magnitude response plots of digital elliptic filters are shown for interpolation by 2 and by 5, respectively, in accordance with the present invention.

It is to be understood that the present invention can be used to produce an excitation signal for use in many types of applications, not limited to vibration analysis. These applications include system analysis, where the systems can be electromechanical systems, such as servos, or can be electrical systems such as electronic circuits, where precise, known excitation is needed so that accurate characterization of the system can be obtained. Other applications include signal generation and feed back control systems.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. An apparatus for synthesizing a designated waveform having a range of frequencies the upper end of which is selectable up to an analysis frequency, wherein the waveform is synthesized from a digital representation of a base level signal sampled at a predetermined sample rate and further wherein each of the samples is taken with a predetermined resolution, comprising means operating at the predetermined resolution and at a fixed conversion rate for converting a digital representation of a signal, presented at the conversion rate, into analog form;

digital filter means for interpolating the digital representation of the base level signal to have an interpolated sample rate corresponding to the conversion rate without modifying the resolution of the samples and simultaneously achieving flat pass band ripple and high stop band attenuation, wherein the interpolated digital representation of the base level signal is supplied directly to the converting means for conversion into analog form; and filter means, having a cutoff frequency which is fixed at a frequency corresponding to the analysis frequency and coupled to the converting means, for suppressing frequencies above the analysis frequency.

2. The apparatus of claim 1, wherein the range of signals include frequencies no greater than the upper end of the range of signals, and further wherein the digital filter means implement an elliptic filter having a cutoff frequency at the upper end of the range of signals.

3. The apparatus of claim 2, wherein the elliptic filter implementation interpolates by a primary interpolation factor determined by dividing the conversion frequency by the predetermined sample rate.

4. The apparatus of claim 3 wherein the elliptic filter implementation comprises a cascaded plurality of digital elliptic filters, each interpolating by a designated interpolation factor, wherein the product of the designated interpolation factors of the cascaded digital elliptic filters equals the primary interpolation factor, and further wherein each of the cascaded plurality of digital elliptic filters are simple interpolator sections having similar pass band/stop band transition characteristics.

5. The apparatus of claim 4, wherein each of the cascaded plurality of digital elliptic filters has the same transition ratio.

6. The apparatus of claims 3, 4, or 5, wherein each digital elliptic filter has a transfer function which can be expressed in z-transform form as having poles and zeros and comprises
- a first section implementing all of the zeros of the transfer function comprising a polyphase implementation of a finite impulse response form having a plurality of parallel signal paths, and further wherein each path implements a selected non overlapping subset of the finite impulse response form coefficients, where the coefficients are a function of the zeros of the filter transfer function; and
- a second section, cascaded with the first section, implementing all of the poles of the transfer function.

7. The apparatus of claim 6 wherein the second section is implemented in an infinite impulse response form.

8. The apparatus of claim 6 wherein each non overlapping subset of finite impulse response coefficients comprise the finite impulse response coefficients that represent active paths of the filter transfer function at a particular point in time.

9. The apparatus of claim 1 further including memory means for storing the digital representation of the base level signal.

10. The apparatus of claim 9 wherein the memory means is a dedicated memory.

11. The apparatus of claim 1 wherein the digital filter means comprises a general purpose digital signal processor implementing a predetermined digital filter form.

12. The apparatus of claim 11 wherein the general purpose digital signal processor implements the predetermined digital filter form by executing a set of instructions stored in a loadable program memory.

13. The apparatus of claim 1 wherein the signals being synthesized are aperiodic.

14. The apparatus of claim 4 wherein the designated interpolation factor of each of the cascaded plurality of digital elliptic filters is either two, four or five.

15. The apparatus of claim 1 wherein the conversion rate is 2.56 times the analysis rate.

16. An apparatus for synthesizing a designated signal having a range of frequencies the upper end of which is selectable up to an analysis frequency, comprising
- dedicated memory means for storing a digital representation of a base level signal, wherein the digital representation of the base level signal has a predetermined sample rate and each sample has a predetermined sample resolution;
- means operating at the predetermined sample resolution and at a fixed conversion rate for converting a digital representation of a signal into analog form;
- digital filter means coupled to the dedicated memory means for expanding the sample rate of the digital representation of the base level signal up to the conversion rate and for supplying the expanded digital representation of the base level signal directly to the converting means, wherein the amount of expansion is determined by dividing the conversion rate by the upper end of the signal range; and
- filter means, having a cutoff frequency which is fixed at a frequency corresponding to the analysis frequency and coupled to the converting means, for suppressing frequencies above the analysis frequency.

17. An interpolating digital filter structure for implementing an elliptic filter function which is expressed in z-transform form as having poles and zeros comprising
- a first section implementing all of the zeros of the transfer function comprising a polyphase implementation of a finite impulse response form having a plurality of parallel signal paths, and further wherein each path implements a selected non overlapping subset of the finite impulse response coefficients, where the coefficients are a function of the zeros of the filter transfer function; and
- a second section, cascaded with the first section, implementing all of the poles of the transfer function.

18. The interpolating digital filter of claim 17 wherein the second section is implemented in an infinite impulse response form.

19. An interpolating digital filter which filter interpolates by a designated primary interpolating factor comprising
- a cascaded plurality of digital elliptic filters, each interpolating by a designated interpolation factor, wherein the product of the designated interpolation factors of the cascaded digital elliptic filters equals the primary interpolation factor, and further wherein each of the cascaded plurality of digital elliptic filters are simple interpolator sections having similar pass band/stop band transition characteristics.

20. The interpolating digital filter of claim 19 wherein each of the plurality of digital elliptic filters implements an elliptic filter function expressed in z-transform form having poles and zeros and comprises
- a first section implementing all of the zeros of the transfer function comprising a polyphase implementation of a finite impulse response form having a plurality of parallel signal paths, and further wherein each path implements a selected non overlapping subset of the finite impulse response coefficients, where the coefficients are a function of the zeros of the filter transfer function; and
- a second section, cascaded with the first section, implementing all of the poles of the transfer function.

21. The interpolating digital filter of claim 20 wherein the second section is implemented in an infinite impulse response form.

22. The apparatus of claim 20 wherein each non overlapping subset of finite impulse response coefficients comprise the finite impulse response coefficients that represent active paths of the filter transfer function at a particular point in time.

* * * * *